(12) United States Patent
Chae et al.

(10) Patent No.: US 7,738,298 B2
(45) Date of Patent: Jun. 15, 2010

(54) FLASH MEMORY DEVICE

(75) Inventors: Dong-Hyuk Chae, Seoul (KR);
Young-Ho Lim, Yongin-si (KR)

(73) Assignee: Samsung Electronics Co., Ltd.,
Suwon-si, Gyeonggie-do (KR)

( * ) Notice: Subject to any disclaimer, the term of this patent is extended or adjusted under 35 U.S.C. 154(b) by 106 days.

(21) Appl. No.: 12/102,262

(22) Filed: Apr. 14, 2008

(65) Prior Publication Data
US 2008/0259690 A1 Oct. 23, 2008

(30) Foreign Application Priority Data
Apr. 17, 2007 (KR) .................. 10-2007-0037517

(51) Int. Cl.
*G11C 16/04* (2006.01)
(52) U.S. Cl. .................. 365/185.17; 365/185.22; 365/185.27
(58) Field of Classification Search ............ 365/185.17, 365/185.18, 185.22, 185.23, 185.27
See application file for complete search history.

(56) References Cited

U.S. PATENT DOCUMENTS

| | | | |
|---|---|---|---|
| 5,652,450 A * | 7/1997 | Hirano | 257/323 |
| 6,788,584 B2 * | 9/2004 | Tedrow et al. | 365/189.04 |
| 7,180,785 B2 * | 2/2007 | Kurihara | 365/185.23 |

FOREIGN PATENT DOCUMENTS

| | | |
|---|---|---|
| JP | 10-178115 | 6/1998 |
| JP | 2003-007099 | 1/2003 |
| KR | 1997-0076847 | 12/1997 |
| KR | 1020000013310 A | 3/2000 |
| KR | 1020040056632 A | 7/2004 |
| KR | 1020050032103 A | 4/2005 |
| KR | 1020060037138 A | 5/2006 |

* cited by examiner

*Primary Examiner*—Gene N. Auduong
(74) *Attorney, Agent, or Firm*—Volentine & Whitt, P.L.L.C.

(57) ABSTRACT

A NAND flash memory device includes a high voltage switch and a bulk voltage supplying circuit. The high voltage switch is configured to transfer a word line voltage to selected word lines of selected memory cells. The bulk voltage supplying circuit is configured to provide a negative voltage to a bulk region of the high voltage switch in response to an operation mode.

10 Claims, 5 Drawing Sheets

FLASH MEMORY DEVICE

PRIORITY STATEMENT

A claim of priority is made to Korean Patent Application No. 10-2007-0037517 filed on Apr. 17, 2007, the subject matter of which is hereby incorporated by reference.

BACKGROUND

1. Field of the Invention

The present invention relates to a semiconductor memory device, and more particularly, to a NAND flash memory device.

2. Description of Related Art

Recent rapid developments in the semiconductor field have resulted in electric appliances being lighter, thinner and smaller. Accordingly, demand for a single power source and low operational power is increasing with respect to semiconductor memory devices used inside electric appliances. However, some types of semiconductor memory devices, such as a flash memory device, use a voltage higher than the power voltage to program a memory cell or to verify a programmed memory cell. This higher voltage, which may be generated through a high voltage generating circuit, is supplied to word lines during programming and erasing operations.

FIG. 1 is a circuit diagram showing a high voltage switch and a cell string structure of a conventional NAND flash memory device. Referring to FIG. 1, a ground selection transistor GST, memory cells MC0~MC31, and a string selection transistor SST are connected in series to form one cell string. The ground selection transistor GST is connected to a common source line CSL, and the string selection transistor SST is connected to a bit line BL. Gates of the memory cells MC0~MC31 are connected to a high voltage switch 10. A string selection line SSL is connected to a gate of the string selection transistor SST, and a ground selection line GSL is connected to a gate of the ground selection transistor GST. When a block is selected, a word line driver (not shown) provides selection signals SS, S0~S31 and GS having corresponding voltages to the lines SSL, WL0~WL31 and GSL, respectively, through the high voltage switch 10.

The high voltage switch 10 consists of high voltage transistors HVTR0~HVTR33, each of which is capable of enduring a high voltage. Sources of the high voltage transistors HVTR0~HVTR33 are connected to the ground selection line GSL (HVTR0), the word lines WL0~WL31 (HVTR1~HVTR32) and the string selection line SSL (HVTR33), respectively. Drains of the high voltage transistors HVTR0~HVTR33 are connected to the selection signals GS (HVTR0), S0~S31 (HVTR1~HVTR32) and SS (HVTR33), respectively. Gates of the high voltage transistors HVTR0~HVTR33 in the switch 10 are connected in common to a block selection line BLKSEL. When a block is selected, the high voltage switch 10 is turned on and then transmits the selection signals (or their voltages) GS, S0~S31 and SS to corresponding lines GSL, WL0~WL31 and SSL, respectively. When a block is not selected, the block selection line BLKSEL is set to have a low level of 0V, so that the high voltage switch 10 is turned off.

FIG. 2 is a cross-sectional view of a high voltage transistor in a conventional high voltage switch, as illustrated in FIG. 1. Although one high voltage transistor HVTRi is illustrated in FIG. 2, it is understood that the remaining high voltage transistors are configured the same as illustrated in FIG. 2. The high voltage transistor HVTRi is formed on a P-type substrate 20 as its bulk, and not on a pocket P-well where memory cells are formed. As illustrated in FIG. 2, a gate voltage $V_G$, a source voltage Vs, a drain voltage Vd, and a bulk voltage Vss are supplied to corresponding terminals, respectively.

The gate oxide layer of the high voltage transistor HVTRi is relatively thick, so that insulation break-down and junction break-down do not occur due to high voltages applied to the high voltage transistor HVTRi. Further, the P-type substrate 20 is lightly-doped and used as a bulk of the high voltage transistor HVTRi. This means that a voltage supplied to the high voltage transistor HVTRi cannot differ from a voltage supplied to the P-type substrate 20. For this reason, the bulk of the high voltage transistor HVTRi is biased with a voltage (e.g., 0V) identical to that applied to the P-type substrate 20. In a conventional NAND flash memory, an erase verification operation is made to check whether threshold voltages of erased memory cells are shifted to an erase state, with 0V supplied to word lines.

A negative voltage must be applied to word lines in order to narrow a threshold voltage distribution of an erase state and/or to program memory cells, so that a threshold voltage is less than 0V. However, it is difficult to sufficiently apply a negative voltage to the word lines via high voltage transistors that are structured as illustrated in FIG. 2. For example, assuming that a ground voltage is applied to terminal Vss and a negative high voltage is supplied to terminal Vd, a PN junction between an N+ impurity region 21 (or a drain of high voltage transistor HVTRi connected to a word line) and a P-type substrate 20 (or P+ impurity region 22) are forward biased. Accordingly, it is difficult to transfer a sufficiently low negative voltage to the word lines.

SUMMARY

According to an exemplary embodiment of the present invention, a NAND flash memory device includes a high voltage switch and a bulk voltage supplying circuit. The high voltage switch is configured to transfer a word line voltage to selected word lines of selected memory cells. The bulk voltage supplying circuit is configured to provide a negative voltage to a bulk region of the high voltage switch in response to an operation mode.

BRIEF DESCRIPTION OF THE DRAWINGS

Embodiments of the present invention will be described with reference to the attached drawings.

DETAILED DESCRIPTION OF THE EMBODIMENTS

Figure 1:
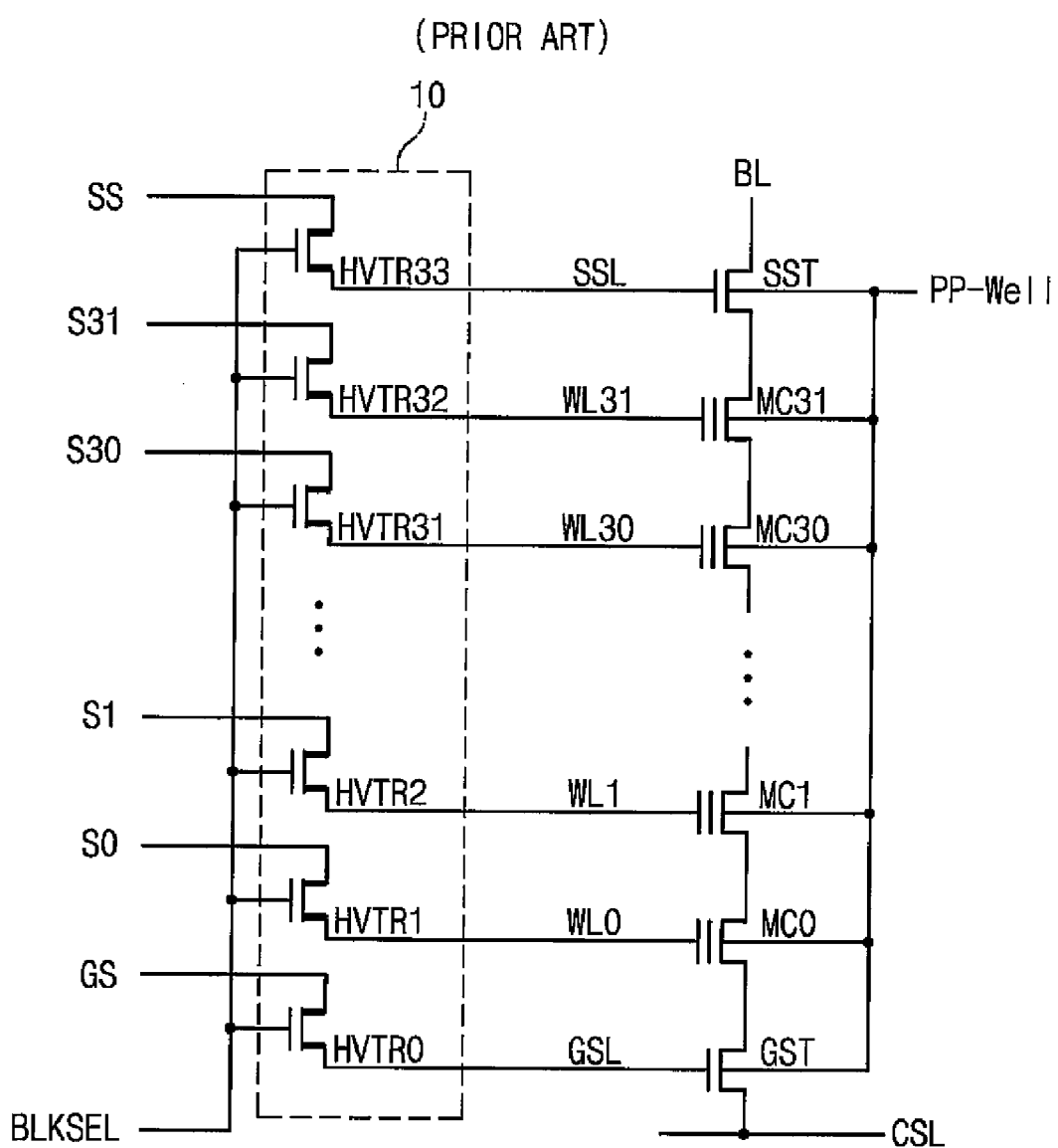
FIG. 1 is a circuit diagram showing a high voltage switch and a cell string structure of a conventional NAND flash memory device.
Figure 2:
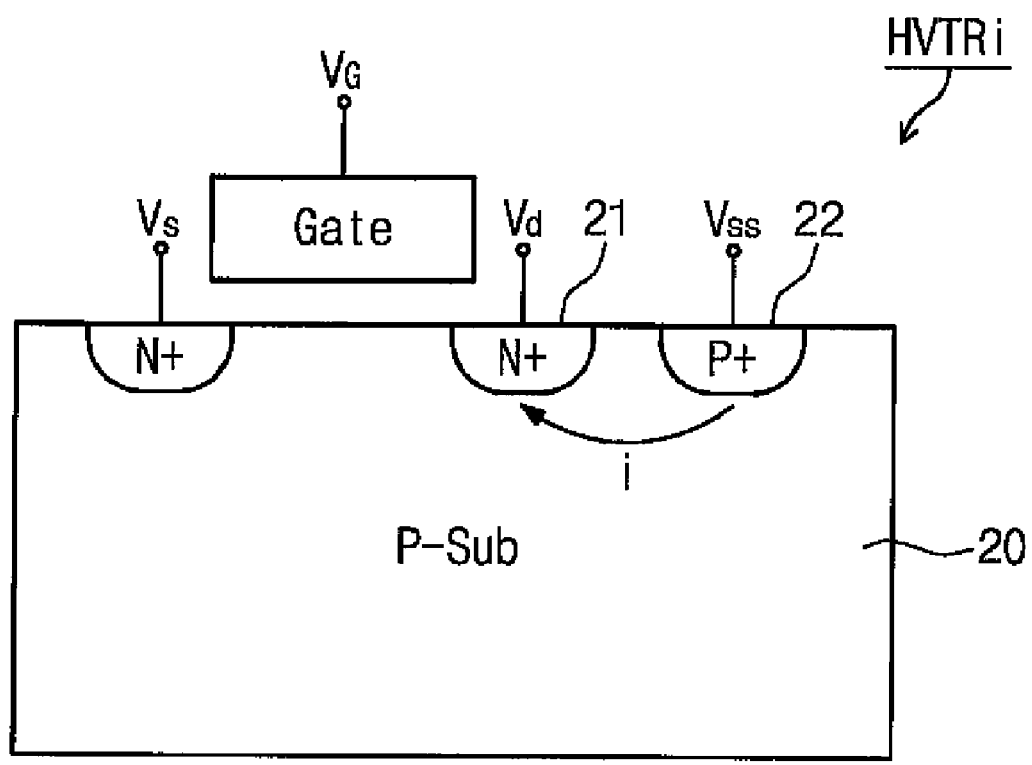
FIG. 2 is a cross-sectional view of a conventional high voltage transistor in a high voltage switch, as illustrated in FIG. 1.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. In the drawings, thicknesses of layers and regions are exaggerated for clarity. Further, it will be understood that when a layer is referred to as being "on" another layer, substrate, etc., it can be directly on the other layer, substrate, etc., or intervening layers may be present. Throughout the drawings and written description, like reference numerals will be used to refer to like or similar elements.

Figure 3:
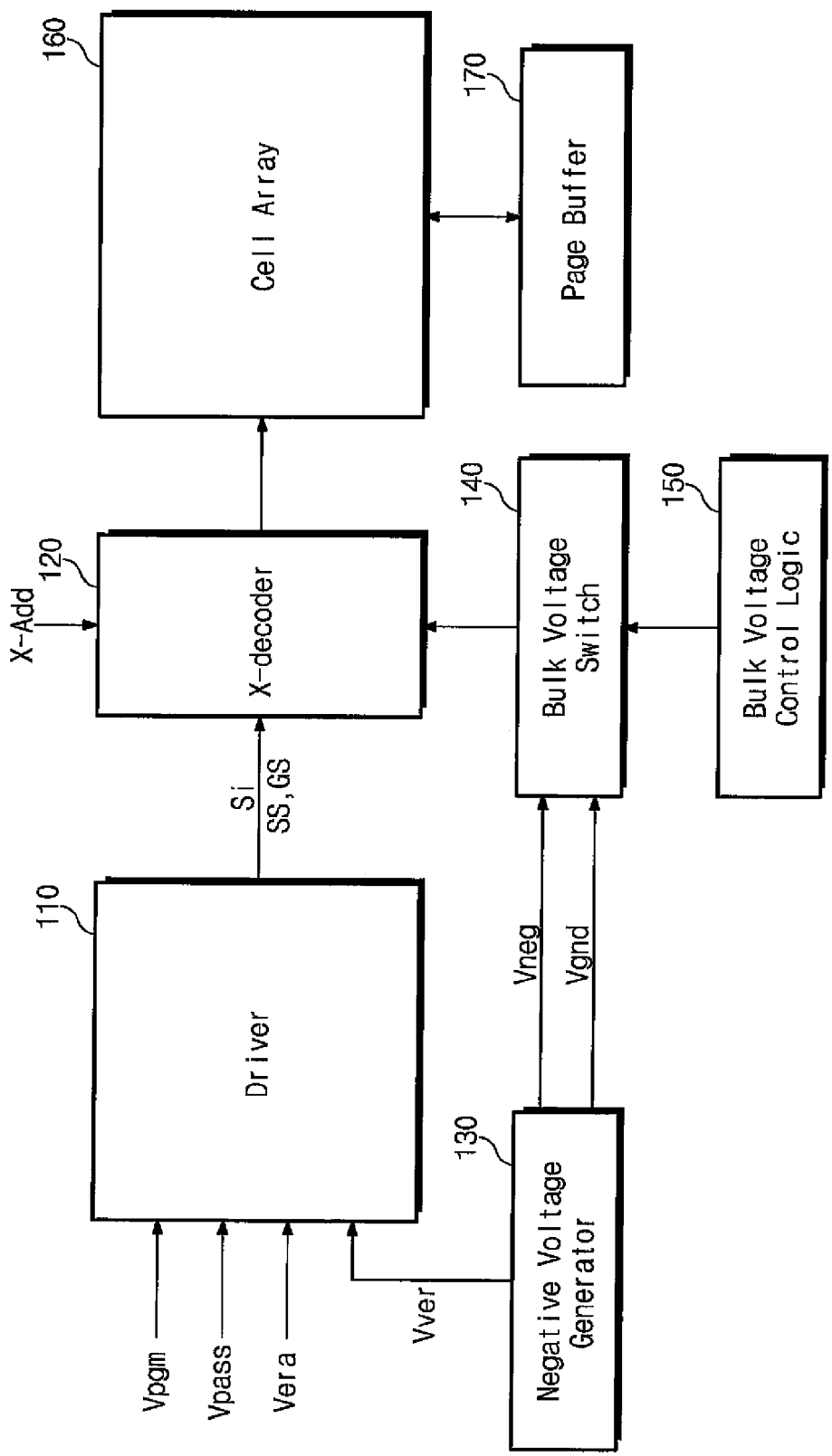
FIG. 3 is a block diagram showing a flash memory device, according to an exemplary embodiment of the present invention.

FIG. 3 is a block diagram of a NAND flash memory device, according to an illustrative embodiment of the present invention Referring to FIG. 3, a program voltage Vpgm, a pass voltage Vpass, an erase voltage Vera, and a verification voltage Vver are provided to a driver 110.

The driver 110 provides a string selection signal SS, a ground selection signal GS, and word line selection signals Si to a row decoder 120 (indicated as "X-decoder"). In particular, the program voltage Vpgm, the pass voltage Vpass, the erase voltage Vera, and the verification voltage Vver may be selectively provided to the respective word lines according to a mode of operation.

For purposes of facilitating explanation of the present embodiment, an example of an erase operation, in which a negative high voltage is supplied to the word lines, will be described. The erase operation is carried out with an erase voltage (e.g. 20V) supplied to a bulk region. After the erase operation, an erase verification operation is performed to confirm whether memory cells are erased normally. In the present example, a negative voltage lower than 0V may be used as an erase verification voltage Vver to narrow a threshold voltage distribution.

The row decoder 120 selects and drives rows of a block in response to a row address (X-Add). For example, the row decoder 120 may transfer output signals of the driver 110 to selected rows (e.g., word lines). This may be accomplished by turning on high voltage transistors in the row decoder 120. In particular, the row decoder 120 may be configured such that bulks of the high voltage transistors are biased with a negative high bulk voltage Vneg from a bulk voltage switch 140. This means that an erase verification voltage Vver from the driver 110 is transferred into a row (e.g., a word line) without voltage drop/loss.

A negative voltage generator 130 generates high negative voltages, for example, and outputs an erase verification voltage Vver and a high negative bulk voltage Vneg of the high voltage transistors. The negative voltage generator 130 also provides a ground voltage Vgnd. The bulk voltage switch 140 selectively supplies a bulk voltage of the high voltage transistors to the row decoder 120 under control of bulk voltage control logic 150. For example, in an erase verification operation, the bulk voltage switch 140 transfers the negative bulk voltage Vneg to the row decoder 120 as the bulk voltage of the high voltage transistors. In operations other than the erase verification operation, the bulk voltage switch 140 provides the ground voltage Vgnd as the bulk voltage of the high voltage transistors. In other words, voltages generated within the negative voltage generator 130 may be selectively provided to the bulk regions of the high voltage transistors by the bulk voltage switch 140.

After an erase voltage is supplied to a bulk of a cell array 160, the driver 110 drives the word line selection signals Si, so that the erase verification voltage Vver is transferred to rows (e.g., word lines) in an erased block. The erase verification voltage Vver is a negative high voltage generated by the negative voltage generator 130. In order to transfer the erase verification voltage Vver to the rows (e.g., word lines) through the high voltage transistors in the row decoder 120, the bulks of the high voltage transistors must be biased with a voltage lower than the erase verification voltage Vver. Accordingly, the memory device may be configured to apply a voltage less than or equal to the erase verification voltage Vver to the bulks of the high voltage transistors in the row decoder 120.

The bulk voltage control logic 150 controls the bulk voltage switch 140 in response to the operation mode. For example, in an erase verification operation, the bulk voltage control logic 150 controls the bulk voltage switch 140 to provide the negative high voltage Vneg as the bulk voltage of the high voltage transistors in the row decoder 120. In operations other than the erase verification operation, the bulk voltage control logic 150 controls the bulk voltage switch 140 to provide the ground voltage Vgnd as the bulk voltage of high voltage transistors in the row decoder 120.

The cell array 160 includes flash memory cells connected to bit lines and word lines. Generally, flash memory cells are connected to form NAND strings, in which flash memory cells are connected in series to a bit line. Multiple NAND strings constitute a memory block, which is an erase unit.

A page buffer 170 operates as a write driver or a sense amplifier, according to the operation modes. For example, the page buffer 170 operates as a sense amplifier in a read operation and as a write driver at a program operation. In an erase verification operation, turn-on states of NAND strings in a selected/erased block are checked with the erase verification voltage Vver applied to corresponding rows (e.g., word lines) in the selected/erased block. As would be apparent to one skilled in the art, the checked values are used to determine whether an erase operation is performed normally.

Figure 4:
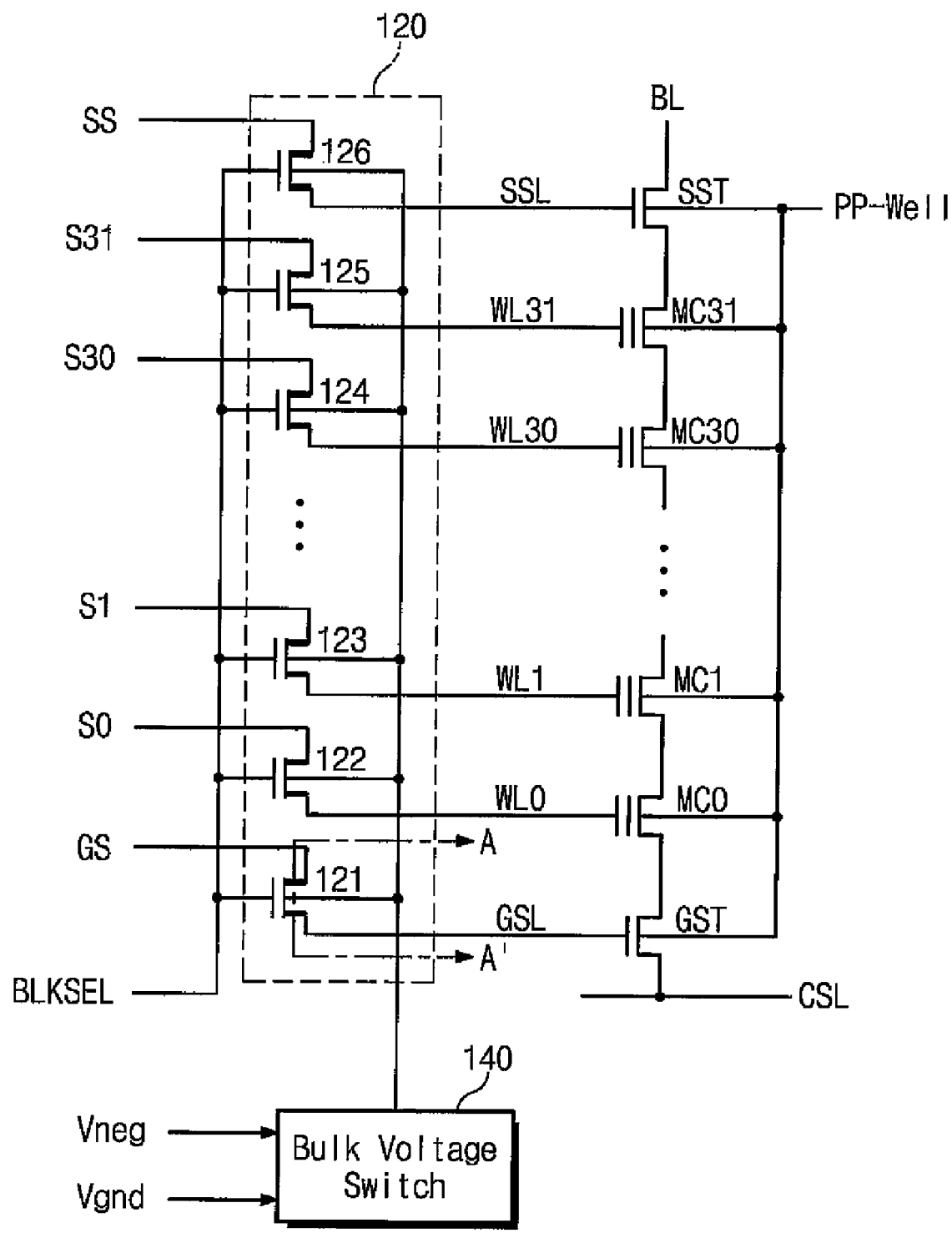
FIG. 4 is a circuit diagram showing a high voltage switch, illustrated in FIG. 3, according to an exemplary embodiment of the present invention.

FIG. 4 is a circuit diagram showing a high voltage switch in a row decoder and a cell string structure of a NAND flash memory, according to an illustrative embodiment of the present invention.

The row decoder 120 has a high voltage switch including high voltage transistors 121~126. Gates of the high voltage transistors 121~126 are connected to a block selection line BLKSEL, and bulks of the high voltage transistors 121~126 are connected in common to an output of the bulk voltage switch 140. In an erase verification operation, for example, the bulk voltage switch 140 selects negative high voltage Vneg as the bulk voltage applied to the bulks of the high voltage transistors 121~126, under control of the bulk voltage control logic 150 in FIG. 3. In operations other than the erase verification operation, the bulk voltage switch 140 selects ground voltage Vgnd as the bulk voltage applied to the bulks of the high voltage transistors 121~126. As a result, it is possible to transfer a negative high voltage for an erase verification operation into rows (e.g., word lines) without voltage drop/loss by biasing the bulks of the high voltage transistors 121~126 with a negative voltage.

Figure 5:
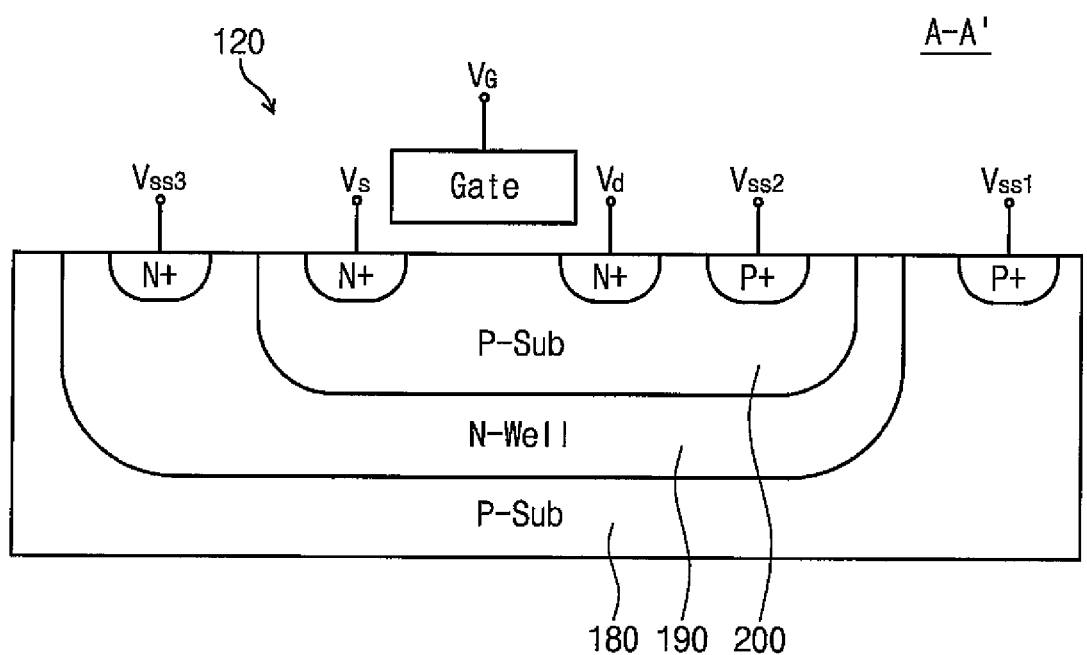
FIG. 5 is a cross-sectional view of a high voltage transistor taken along a dotted line A-A' in FIG. 4, according to an exemplary embodiment of the present invention.

FIG. 5 is a cross-sectional view of a high voltage transistor taken along a dotted line A-A' in FIG. 4, according to an illustrative embodiment of the invention.

The high voltage switch 120 includes multiple NMOS transistors, for example, as high voltage transistors. FIG. 5 illustrates a cross-sectional structure of one such NMOS transistor. The NMOS transistor is formed in a bulk region 200, which is isolated from a P-type substrate 180 by an N-type well 190, biasing the bulk region 200 and the P-type substrate 180 with different voltages. More specifically, a ground voltage of 0V is supplied to the substrate 180 and the N-type well 190, while the bulk region 200 of the NMOS transistor is biased with a negative bulk voltage Vss2 lower than a drain voltage Vd (e.g., Vss2=−2V, Vd=−1V). In other words, the PN junction between the bulk region 200 and the drain/source of the NMOS transistor is reverse biased by maintaining the bulk region 200 of the high voltage switch/transistor with a voltage equal to or less than a negative voltage that is transferred to word lines. Accordingly, it is possible to transfer negative charge from the source of the NMOS transistor to the drain of the NMOS transistor by preventing the PN junction between the drain/source of the NMOS transistor and the bulk region 200 from being forward biased. This enables a verification voltage to be transferred to a word line connected to the source of the NMOS transistor without voltage loss.

In an embodiment, the bulk region 200 of the NMOS transistor may be formed by a high-energy ion implanting process instead of a well process. In accordance with the well process, a deep N-type well is first formed in a P-type well. Then, a highly doped pocket P-type well is formed as a bulk region in the deep N-type well. In comparison, according to the high-energy ion implanting process, the bulk region 200 is formed by implanting highly energized ions into the P-type substrate to form the N-type well. Accordingly, the bulk region 200 is not a highly doped region, but a P-type substrate island. The islanded P-type substrate is used as the bulk region where high voltage transistors of the high voltage switch 120 are formed. This bulk structure enables the bulk region 200 and the P-type substrate 180 to be biased with different voltages, as discussed above. It would be apparent to one skilled in the art that the bulk region is doped with P-type impurities in the depicted embodiment in order to adjust threshold voltages of the high voltage transistors.

As described above, the NAND flash memory device enables a negative high voltage to be transferred to word lines without voltage loss, thus enhancing erasing performance, and enabling threshold voltage ranges of the cells to be more widely used.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A NAND flash memory device comprising:
   a high voltage switch configured to transfer a word line voltage to selected word lines of selected memory cells; and
   a bulk voltage supplying circuit configured to provide a negative voltage to a bulk region of the high voltage switch in response to an operation mode,
   wherein the bulk region of the high voltage switch is isolated from a substrate by an N-type well, formed using a high-energy ion implantation process, so that the bulk region of the high voltage switch has the same concentration as the substrate, and
   wherein a bulk region voltage applied to the bulk region is different from a substrate voltage applied to the substrate during the operation mode.

2. The NAND flash memory device as claimed in claim 1, wherein the operation mode comprises an operation for verifying whether the selected memory cells are erased normally.

3. The NAND flash memory device as claimed in claim 1, wherein the operation mode comprises an operation in which the selected memory cells are programmed to have a negative threshold voltage.

4. The NAND flash memory device as claimed in claim 1, wherein the word line voltage is less than 0V.

5. The NAND flash memory device as claimed in claim 4, wherein the negative voltage is equal to or less than the word line voltage.

6. The NAND flash memory device as claimed in claim 1, wherein the bulk voltage supplying circuit comprises:
   a negative voltage generator configured to generate the negative voltage; and
   a bulk voltage switch configured to provide one of the negative voltage and a ground voltage to the bulk region of the high voltage switch, the bulk voltage switch being controlled by bulk voltage control logic in response to the operation mode.

7. The NAND flash memory device as claimed in claim 6, wherein the negative voltage generator generates an erase verification voltage.

8. A flash memory device comprising:
   a high voltage switch comprising a plurality of high voltage transistors, each high voltage transistor comprising a bulk region, the high voltage switch being configured to transfer a word line voltage to selected word lines corresponding to memory cells
   a voltage generator configured to provide a negative voltage and a ground voltage; and
   a bulk voltage switch configured to provide one of the negative voltage and the ground voltage to the bulk region of at least one high voltage transistor of the plurality of high voltage transistors in response to an operation mode,
   wherein the bulk region of the at least one high voltage transistor is isolated from a substrate by an N-type well, formed using a high-energy ion implantation process, so that the bulk region of the at least one high voltage transistor has the same concentration as the substrate, and
   wherein a bulk region voltage applied to the bulk region is different from a substrate voltage applied to the substrate during the operation mode.

9. The flash memory device as claimed in claim 8, wherein, when the operation mode comprises an erase verification operation, the bulk voltage switch provides the negative voltage to the bulk region of the at least one high voltage transistor.

10. The flash memory device as claimed in claim 9, wherein the negative voltage is less than or equal to an erase verification voltage.

* * * * *